United States Patent
Aoki et al.

(10) Patent No.: US 7,595,581 B2
(45) Date of Patent: Sep. 29, 2009

(54) THIN-FILM PIEZOELECTRIC DEVICE AND METHOD OF MANUFACTURING THE SAME

(75) Inventors: Tsuyoshi Aoki, Kawasaki (JP); Kazuaki Kurihara, Kawasaki (JP); Shigeyoshi Umemiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 138 days.

(21) Appl. No.: 11/487,509

(22) Filed: Jul. 17, 2006

(65) Prior Publication Data

US 2007/0228871 A1  Oct. 4, 2007

(30) Foreign Application Priority Data

Mar. 30, 2006  (JP)  ............... 2006-095248

(51) Int. Cl.
*H01L 41/08* (2006.01)
(52) U.S. Cl. .................................... 310/328
(58) Field of Classification Search ......... 310/330–332, 310/328, 334, 358, 359; 360/294.4, 291.9
See application file for complete search history.

(56) References Cited

U.S. PATENT DOCUMENTS

| | | | | |
|---|---|---|---|---|
| 4,129,799 A * | 12/1978 | Green | ................. | 310/359 |
| 4,398,325 A * | 8/1983 | Piaget et al. | ................. | 29/25.35 |
| 4,412,148 A * | 10/1983 | Klicker et al. | ................. | 310/358 |
| 5,259,099 A * | 11/1993 | Banno et al. | ................. | 29/25.35 |
| 6,362,542 B1 * | 3/2002 | Novotny | ................. | 310/12 |
| 6,384,516 B1 * | 5/2002 | Fraser | ................. | 310/334 |
| 6,469,422 B2 * | 10/2002 | Fraser | ................. | 310/334 |
| 6,476,539 B1 * | 11/2002 | Takeuchi et al. | ................. | 310/330 |
| 7,068,474 B2 * | 6/2006 | Kuwajima et al. | ................. | 360/294.4 |
| 7,312,955 B2 * | 12/2007 | Kuwajima et al. | ................. | 360/294.4 |

FOREIGN PATENT DOCUMENTS

| | | | |
|---|---|---|---|
| JP | 7-262726 A | 10/1995 |
| JP | 9-82014 A | 3/1997 |
| JP | 2003-37307 A | 2/2003 |
| JP | 3501758 B2 | 12/2003 |
| WO | WO 00/30080 A1 | 5/2000 |

* cited by examiner

*Primary Examiner*—Mark Budd
(74) *Attorney, Agent, or Firm*—Greer, Burns & Crain, Ltd.

(57) ABSTRACT

A thin-film piezoelectric device is disclosed that includes a substrate, a piezoelectric pattern disposed on the substrate, the piezoelectric pattern including plural spaced-apart piezoelectric regions, and a pair of electrodes that apply an electric field to the piezoelectric pattern.

9 Claims, 7 Drawing Sheets

THIN-FILM PIEZOELECTRIC DEVICE AND METHOD OF MANUFACTURING THE SAME

BACKGROUND OF THE INVENTION

1. Field of the Invention

The present invention relates to a thin-film piezoelectric device and a method of manufacturing the same, and particularly relates to a thin-film piezoelectric actuator/sensor utilizing deflection of a substrate due to piezoelectric effect of ferroelectric ceramics and a method of manufacturing the same.

2. Description of the Related Art

Thin-film piezoelectric actuators are configured to drive objects using the piezoelectric effect of piezoelectric (electrostrictive) ceramic thin films formed on substrates. Piezoelectric substances generate a voltage in response to an applied force or stress (piezoelectric effect or electrostrictive effect). This effect is reversible. That is, piezoelectric substances are deformed in response to an applied voltage. In the following description, both the piezoelectric effect and the reversed effect are referred to as piezoelectric effect for ease of explanation.

Usually, ferroelectric piezoelectric ceramics exhibit strong piezoelectric effect. Thin-film actuators/sensors of piezoelectric ceramics are expected to be applied especially to suspensions of hard disk drives. This is because increase of hard disk drive storage capacity has generated a growing demand for distance control between magnetic heads and media (medium).

Patent document 1 discloses a configuration for improving tracking accuracy of high density HDDs, in which an actuator/sensor for displacing a magnetic head slider relative to a suspension is disposed between the head slider and the suspension.

Patent document 2 discloses a method of controlling flying height of a magnetic head. According to the disclosed method, a voltage is applied between a magnetic disk and a head slider. Thus, opposite electric charges are generated on the opposing faces of the head slider and the magnetic disk, thereby producing attraction force, which maintains a constant flying force.

Patent Document 3 discloses a method of maintaining a constant flying height of a magnetic head by actively controlling displacement of the magnetic head. According to this method, a sensor provided on a suspension for supporting the magnetic head detects deformation of the suspension. A correction signal corresponding to the amount of the deformation detected by the magnetic head is applied to a thin film (actuator) of piezoelectric ceramics provided also on the suspension. The actuator of piezoelectric ceramics corrects the position of the suspension, thereby maintaining a constant flying height of the head relative to the magnetic disk.

<Patent Document 1> Japanese Patent No. 3501758

<Patent Document 2> Japanese Patent Laid-Open Publication No. 9-82014

<Patent Document 2> Japanese Patent Laid-Open Publication No. 7-262726

Thin films of ceramics are formed on substrates typically by a sputtering method, a sol-gel method, a pulse laser deposition method, a MOCVD method or the like. These methods include a high temperature heat treatment at 500° C. or higher for ceramic crystallization. However, when the temperature is lowered to room temperature after ceramic crystallization by the heat treatment, the difference in thermal expansion coefficients of the ceramics and the substrates causes cracking of the ceramics and large warpage of the substrates. This problem often occurs especially when thin substrates such as suspensions are used.

SUMMARY OF THE INVENTION

In view of the foregoing, the present invention is directed to a configuration of a thin-film piezoelectric device that prevents, even if a thin film of piezoelectric ceramic is formed on a thin substrate, cracking of the ceramic thin film and warpage of the substrate, and enhances reliability of the performance of the thin-film piezoelectric device, and a method of manufacturing the thin-film piezoelectric device.

According to an aspect of the present invention, a piezoelectric substance formed on a substrate includes plural spaced-apart regions arranged in a predetermined pattern.

According to an aspect of the present invention, there is provided a thin-film piezoelectric device that comprises (a) a substrate;

(b) a piezoelectric pattern disposed on the substrate, the piezoelectric pattern including plural spaced-apart piezoelectric regions; and (c) a pair of electrodes that apply an electric field to the piezoelectric pattern.

It is preferable that each piezoelectric region be elongated in a longitudinal direction of the substrate and be arranged longitudinally offset relative to the adjacent piezoelectric region in a width direction of the substrate.

It is also preferable that the piezoelectric regions be spaced apart by one or more first spacing sections extending in a longitudinal direction of the substrate and one or more second spacing sections extending in a width direction of the substrate and that the piezoelectric regions be arranged such that the second spacing section does not extend in the width direction of the substrate uninterrupted by at least one of the piezoelectric regions.

According to a second aspect of the present invention, there is provided a magnetic head support mechanism that comprises (a) a magnetic head;

(b) a suspension substrate that supports the magnetic head; and (c) a thin-film piezoelectric actuator/sensor disposed on the suspension substrate;

wherein the thin-film piezoelectric actuator/sensor includes a piezoelectric pattern including plural spaced-apart piezoelectric regions.

It is preferable that each piezoelectric region be elongated in a longitudinal direction of the suspension substrate and be arranged longitudinally offset relative to the adjacent piezoelectric region in a width direction of the suspension substrate.

According to a third aspect of the present invention, there is provided a method of manufacturing a thin-film piezoelectric device. The method comprises (a) a step of forming a lower electrode on a substrate;

(b) a step of forming an amorphous film of a piezoelectric material on the lower electrode;

(c) a step of patterning the amorphous film so as to form plural elongated regions in a predetermined arrangement;

(d) a step of crystallizing the patterned amorphous film so as to form a piezoelectric pattern including the elongated regions; and (e) forming an upper electrode on the piezoelectric pattern.

In one embodiment of the present invention, cracking of a piezoelectric thin film and warpage of a substrate do not occur even after a heat treatment is performed in a thin-film forming process, so that a cantilever is uniformly displaced (deflected).

This invention is applicable not only to thin-film piezoelectric actuators/sensors but also to various thin-film piezoelectric devices using piezoelectric materials such as acceleration sensors, pressure sensors, and displacement sensors.

BRIEF DESCRIPTION OF THE DRAWINGS

FIGS. 5A-7O illustrate a process of manufacturing a thin-film piezoelectric actuator/sensor according to an embodiment of the present invention.

DETAILED DESCRIPTION OF THE PREFERRED EMBODIMENT

Figure 1:
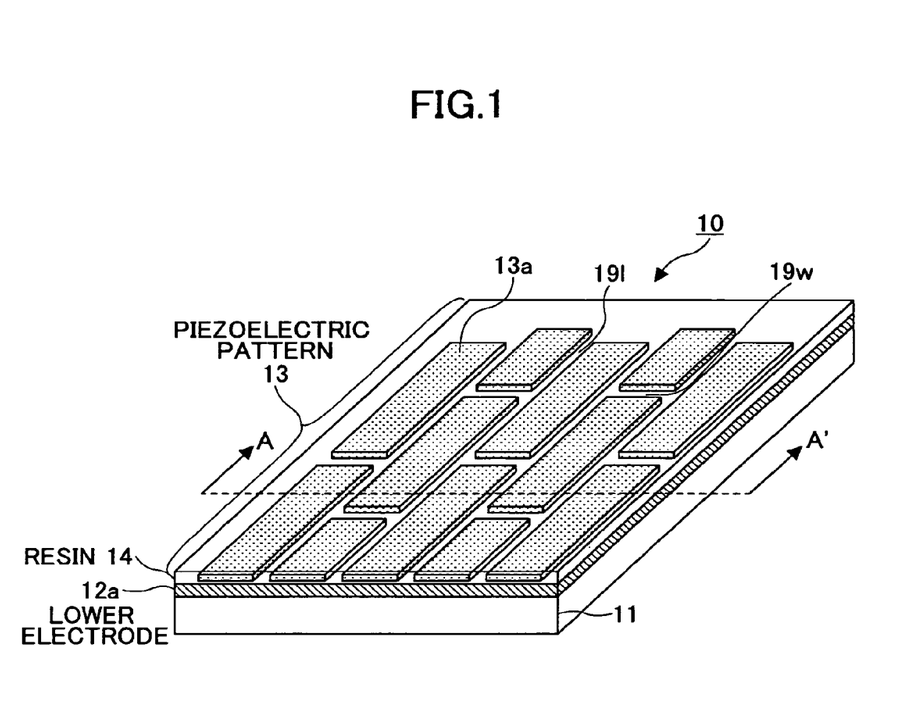
FIG. 1 is a schematic perspective view showing a part of a thin-film piezoelectric actuator/sensor according to an embodiment of the present invention.
Figure 2:
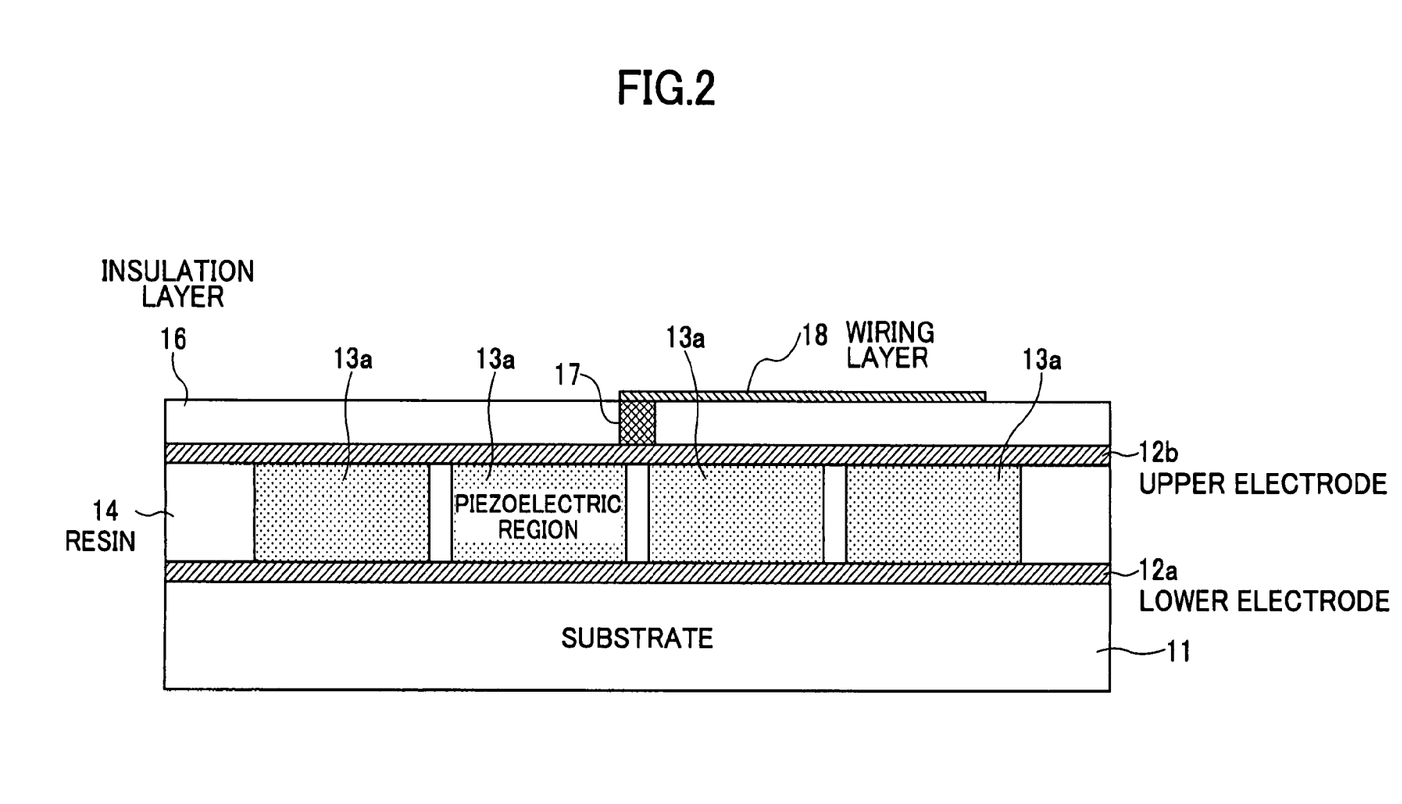
FIG. 2 is a cross-sectional view showing the thin-film piezoelectric actuator/sensor taken along line A-A' of FIG. 1.

FIG. 1 is a schematic perspective view showing a part of a thin-film piezoelectric actuator/sensor 10 according to an embodiment of the present invention (an upper electrode 12b and a wiring layer 18 are not shown in order to more easily view other components). FIG. 2 is a cross-sectional view showing the thin-film piezoelectric actuator/sensor 10 taken along line A-A' of FIG. 1.

The thin-film piezoelectric actuator/sensor 10 comprises a substrate 11, a pair of a lower electrode 12a and the upper electrode 12b disposed on the substrate 11, a piezoelectric pattern 13 disposed between the lower electrode 12a and the upper electrode 12b and including plural piezoelectric regions 13a, and resin 14 in the space between the piezoelectric regions 13a. The thin-film piezoelectric actuator/sensor 10 further comprises the wiring layer 18. The wiring layer 18 applies a voltage to the piezoelectric pattern 13 through a via contact 17, which is formed in an insulation layer 16, and the upper electrode 12b. The piezoelectric pattern 13 is divided into the piezoelectric regions 13a when in an amorphous state as described below.

The substrate 11 may be formed of, but not limited to, a thin metal material, a thin alloy material, a semiconductor, or an insulator. The electrodes 12a and 12b may be any conductors and be formed of, e.g., metal or conductive oxide. The piezoelectric pattern 13 is formed of a piezoelectric ceramic that is mechanically deformable by electric fields. Examples of such piezoelectric ceramics may include piezoelectric materials such as lead zirconate titanate (PZT: (Pb(Zr,Ti)O3) and electrostrictive materials such as lead lanthanum zirconate titanate (PLZT: (Pb,La)(Zr,Ti)O3).

The resin 14 in the space between the piezoelectric regions 13a is for insulating the electrodes 12a and 12b that apply a voltage to the piezoelectric pattern 13 and may include epoxy, acryl, and/or polyimide. Resin materials have low Young's modulus and therefore do not prevent displacement of a cantilever. Other resin materials may alternatively be used that adhere to ceramics, fill the space between the piezoelectric regions 13a and around the piezoelectric pattern 13, and are not separated during processing.

Figure 3:
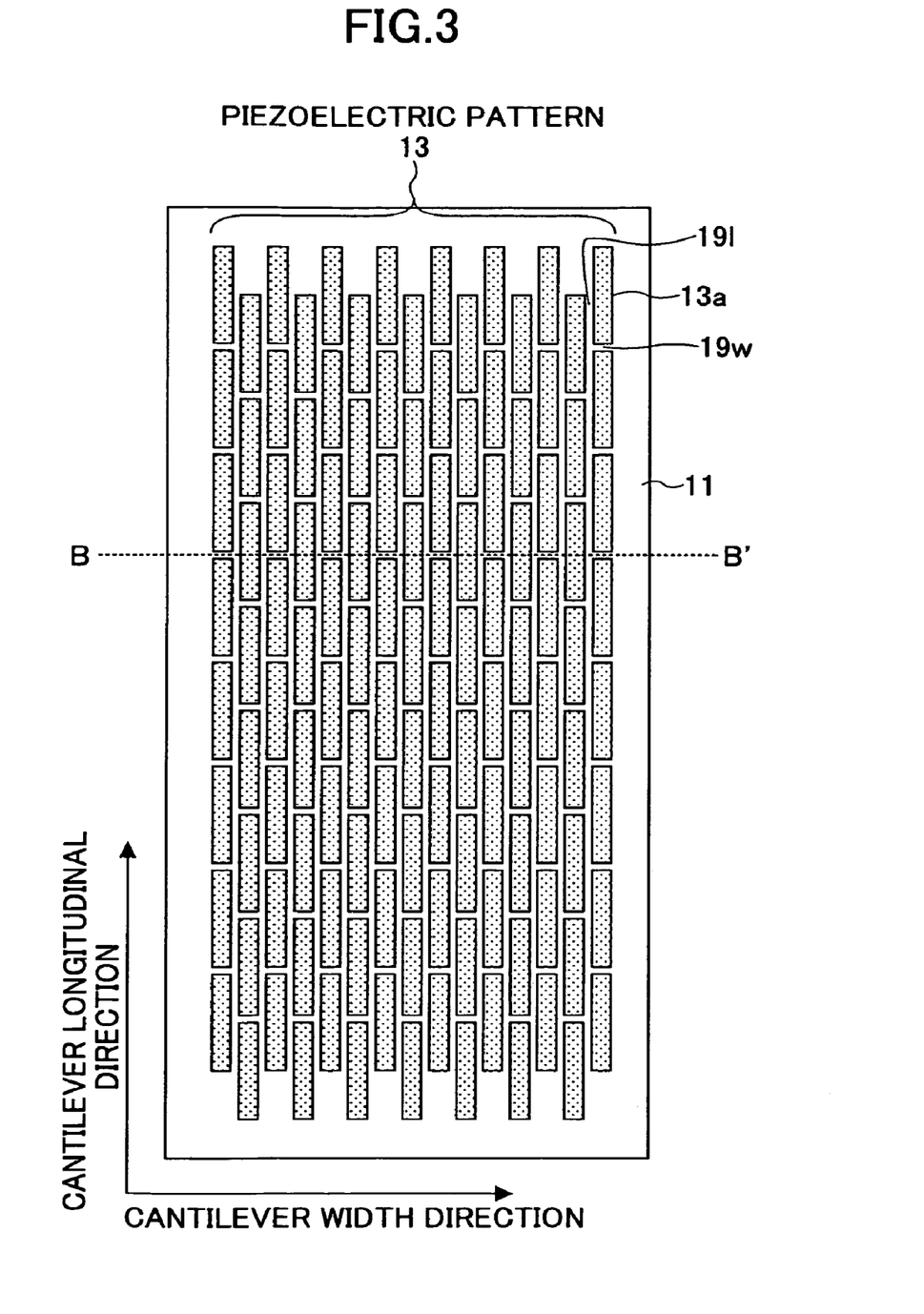
FIG. 3 shows an example of a piezoelectric pattern.

Referring to FIG. 3, the substrate 11 has an elongated shape and forms a cantilever. In the example shown in FIG. 3, each of the piezoelectric regions 13a forming the piezoelectric pattern 13 is an elongated area extending in the longitudinal direction of the substrate 11. More specifically, the piezoelectric pattern 13 includes plural piezoelectric rows (fifteen rows in the example shown in FIG. 3) that are spaced apart by spacing sections (spaces) 19l extending in the cantilever longitudinal direction. Each piezoelectric row includes one or more of the piezoelectric regions 13a, and multiple piezoelectric regions 13a are longitudinally separated by spacing sections 19w extending in the cantilever width direction. Each piezoelectric region 13a has an area of, e.g., 2 μm×10 μm. The piezoelectric region 13a are spaced apart by the spaces 19l by 1 μm from the piezoelectric regions 13a in the adjacent row in the width direction and are spaced apart by the spaces 19w by 1 μm from the adjacent piezoelectric regions 13a in the longitudinal direction.

The piezoelectric regions 13a are formed by forming the spaces 19l and 19w in a ceramic film in an amorphous state for dividing the ceramic film. As the spaces 19l and 19w are formed in the ceramic film, the contact area between the ceramic film and the substrate 11 is reduced. This prevents or substantially inhibits cracking of the ceramic film and reduces warpage of the substrate 11 even when temperature is lowered after a high-temperature crystallization process.

Each space 19w is offset from spaces 19w in the adjacent piezoelectric row or rows in the cantilever width direction. This arrangement prevents the spaces 19w in piezoelectric rows adjacent one another in the width direction from being aligned with each other in the width direction, i.e. uninterrupted by a piezoelectric region 13a, and completely dividing the piezoelectric pattern 13 in the cross section (B-B') at a given point of the cantilever. In other words, one or more piezoelectric regions 13a are present in the cross section (B-B') at any given point of the cantilever in the width direction of the piezoelectric pattern 13. Accordingly, the cantilever is uniformly deflected without forming nodes.

Referring back to FIG. 2, the resin 14 is disposed in the space between and around the piezoelectric regions 13a. The common upper electrode 12b is disposed on the piezoelectric pattern 13 for uniformly applying voltage to the piezoelectric regions 13a. The resin 14 is typically elastic and therefore dose not prevent displacement of the piezoelectric pattern 13. If the resin 14 is piezoelectric resin, displacement (deflection) of the thin-film piezoelectric actuator/sensor 10 is more accurately controlled.

Figure 4:
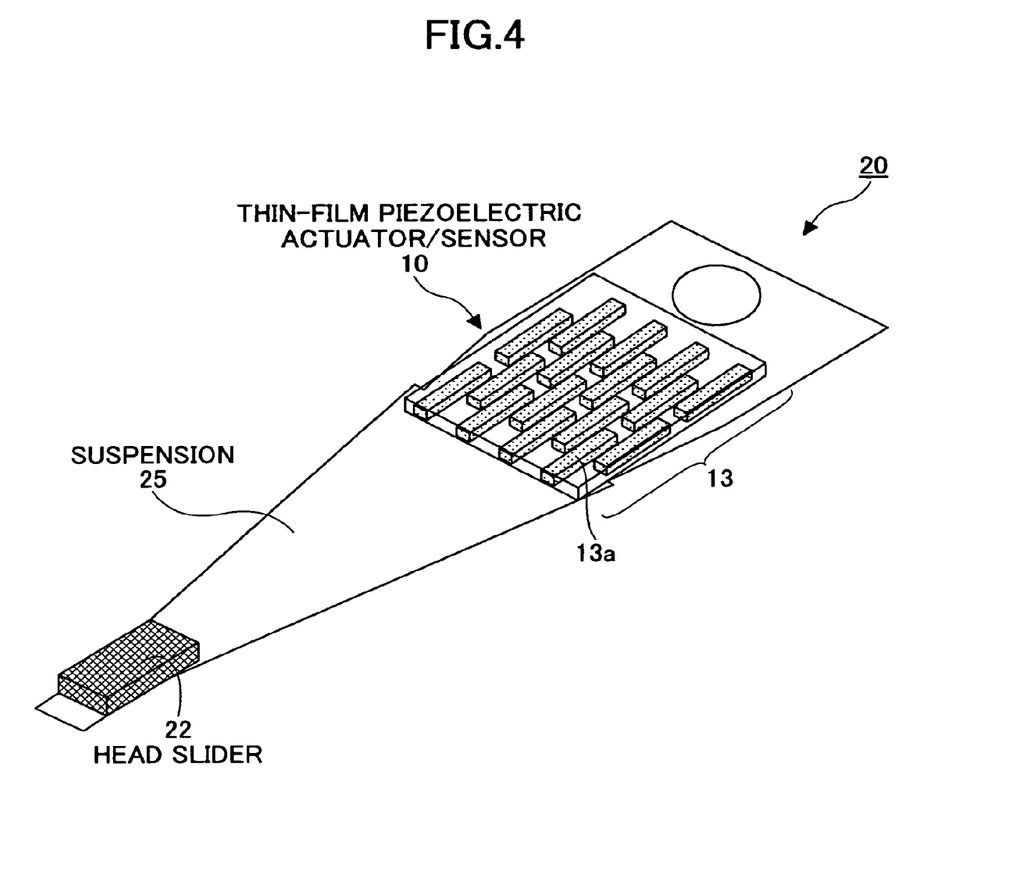
FIG. 4 shows a thin-film piezoelectric actuator/sensor mounted on a suspension of a magnetic disk device.

FIG. 4 schematically shows a magnetic head support mechanism 20 including the thin-film piezoelectric actuator/sensor 10 of FIGS. 1-3. The magnetic head support mechanism 20 comprises a head slider 22 for a hard disk drive, a suspension 25 supporting the slider 22, and the thin-film piezoelectric actuator/sensor 10 disposed on the suspension 25. As the configuration of the thin-film piezoelectric actuator/sensor 10 with the piezoelectric pattern 13 in which the adjacent piezoelectric regions 13a are arranged offset relative to each other is applicable even on the suspension 25 supporting the slider 22 and having a small thickness, the flying height of the slider 22 relative to a magnetic medium can be controlled.

FIGS. 5A-7O illustrate a process of manufacturing the thin-film piezoelectric actuator/sensor 10 of FIGS. 1 and 2.

Figure 5A:
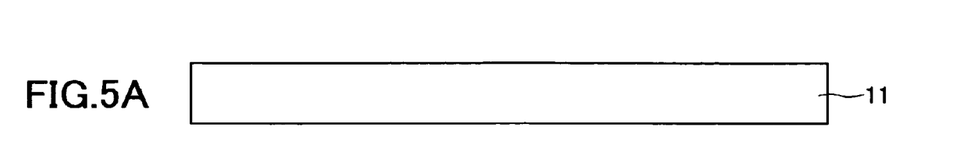

First, as shown in FIG. 5A, the thin substrate 11 (e.g. a stainless plate (SUS304) with a thickness of 50 μm) is prepared.

Figure 5B:
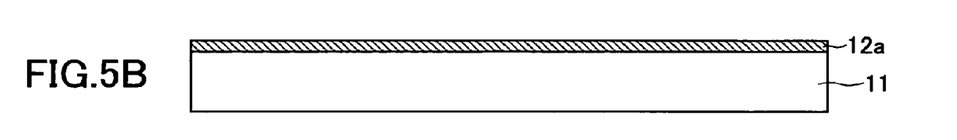

Then, as shown in FIG. 5B, the lower electrode 12a is formed on the substrate 11. For example, the lower electrode 12a may be formed by sputtering platinum (Pt) to a thickness of 200 nm. A vacuum deposition or the like may be used in place of sputtering. The lower electrode 12a may be formed of high-temperature resistant materials including strontium ruthenium oxide (SrRuO3), which is conductive oxide, and titanium nitride (TiN), which is conductive nitride, in place of high melting point metal such as platinum.

Figure 5C:
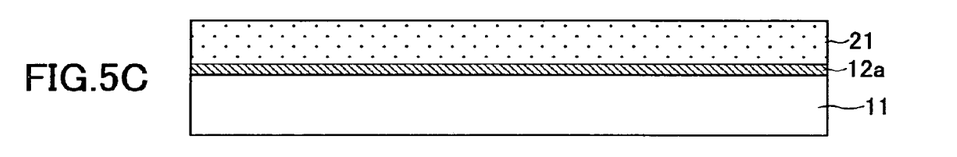

Then, as shown in FIG. 5C, an amorphous film 21 of ceramic as a piezoelectric substance is formed on the lower electrode 12a. For example, the amorphous film 21 may be formed by sputtering PZT to a thickness of 2 µm at room temperature, or by using pulse laser deposition (PLD) or MOCVD. The amorphous film 21 may be formed to have multiple layers by applying PZT plural times using a sol-gel method without involving any heating process.

Figure 5D:
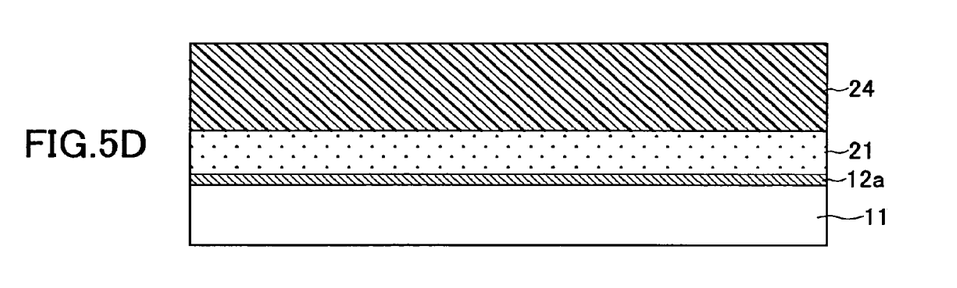

Then, referring to FIG. 5D, resist 24 of 10 µm thickness is formed on the amorphous film 21. While the resist 24 is photoresist in this embodiment, the resist 24 may alternatively be KrF resist, ArF resist, or EB resist.

Figure 5E:
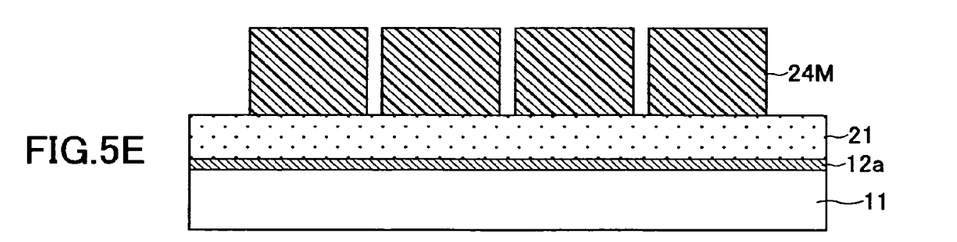

Then, referring to FIG. 5E, the resist 24 is exposed and developed by lithography to form a resist mask 24M with a desired pattern. The pattern of the resist mask 24M corresponds to the pattern of the piezoelectric pattern 13 shown in FIG. 3, for example.

Figure 6F:
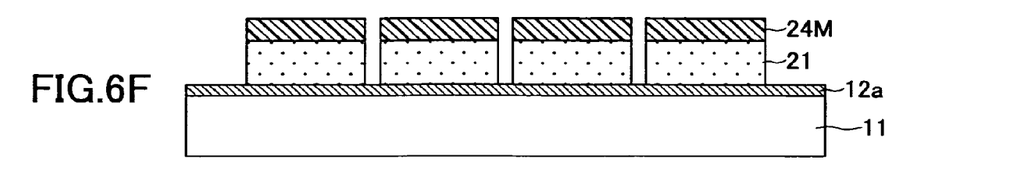

Then, referring to FIG. 6F, the amorphous film 21 of piezoelectric ceramics is patterned by etching. The etching may be dry etching or wet etching. In the case of dry etching, inductively-coupled plasma (ICP) and electron cyclotron plasma (ECR) may be used. The amorphous film 21 of piezoelectric ceramics is processed using etching gas such as Ar, CF4, and SF6 under a suitable plasma processing condition such that the amorphous film 21 of piezoelectric ceramics has side walls perpendicular to the substrate 11. In the case of wet etching, strong acid such as fluorinated acid is used. It is preferable to form a protection layer of polyimide to prevent other parts such as the substrate 11 from being damaged.

Figure 6G:
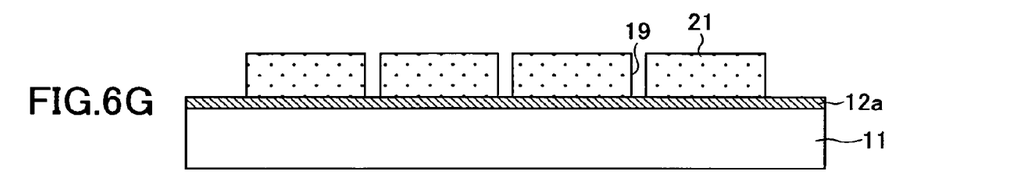

Then, as shown in FIG. 6G, the resist mask 24M is removed. As a result of etching, the amorphous film 21 is patterned to form raised areas of 2 µm×10 µm spaced apart by the spaces 19 (spaces 19l and 19w) of 1 µm width as described with reference to FIG. 3. The width of the spaces 19 is preferably not more than three times the thickness of the amorphous film 21 so as to produce sufficient piezoelectric effect and to prevent warpage of the substrate 11.

Figure 6H:
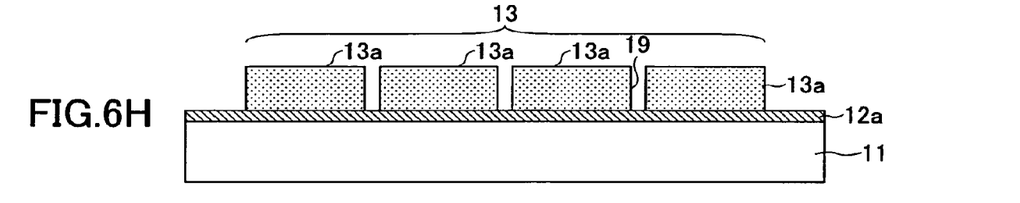

Then, referring to FIG. 6H, the patterned amorphous film 21 of piezoelectric ceramic is crystallized by, e.g., sintering, so that the piezoelectric pattern 13 including the piezoelectric regions 13a is formed. Since the amorphous film 21 is patterned before being crystallized, heat stress is reduced.

Figure 6I:
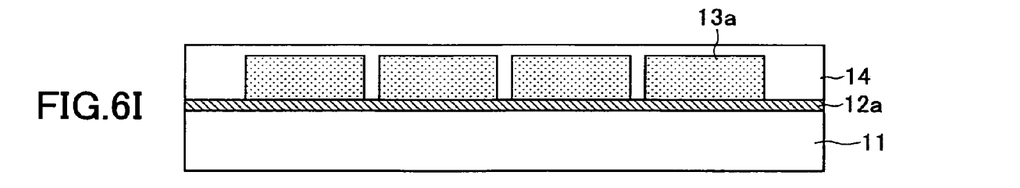

Then, as shown in FIG. 6I, the resin 14 is disposed in the space between and around the piezoelectric regions 13a. The resin 14 may include acrylic, epoxy, and polyimide. More specifically, varnish of low viscosity containing solvent with such resin dissolved therein is applied on the piezoelectric pattern 13 by spin coating or dipping.

Figure 6J:
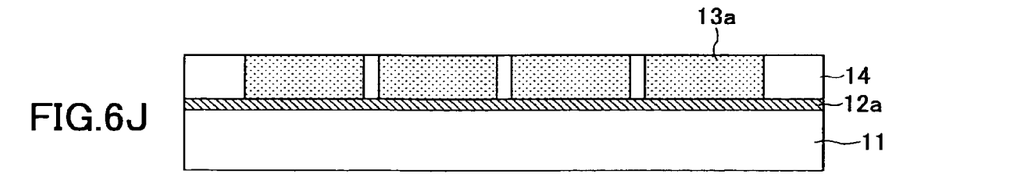

Then, referring to FIG. 6J, the height of the resin 14 is reduced to the height of the piezoelectric pattern 13 after drying the resin 14. For example, the resin 14 is etched by reactive ion etching (RIE) or polished by chemical mechanical polishing until the upper surface of the piezoelectric pattern 13 is exposed.

Figure 7K:
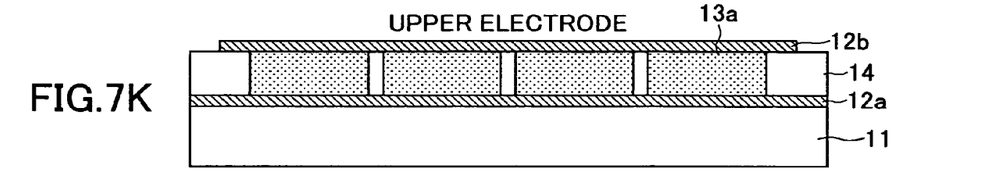

Then, as shown in FIG. 7K, the upper electrode 12b is formed on the piezoelectric pattern 13 and the resin 14. The upper electrode 12b is formed by sputtering, vacuum deposition or the like at a temperature low enough to prevent the resin 14 from being deformed by heat and from volatilizing. The temperature may be room temperature. In this step, a metal through mask is applied to the area where the upper electrode 12b is to be formed. The upper electrode 12b may be formed of metal, oxide or the like.

Figure 7L:
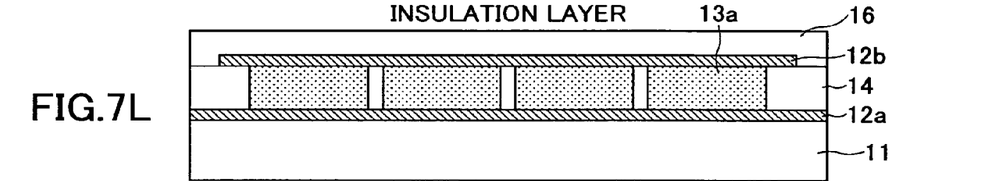

Then, as shown in FIG. 7L, the insulation layer 16 is formed on the entire surface. For example, the insulation layer 16 may be a polymer film formed by spin coating or dipping, or may be a silica film or an alumina film formed by sputtering. The thickness of the insulation layer 16 may be about 2 µm.

Figure 7M:
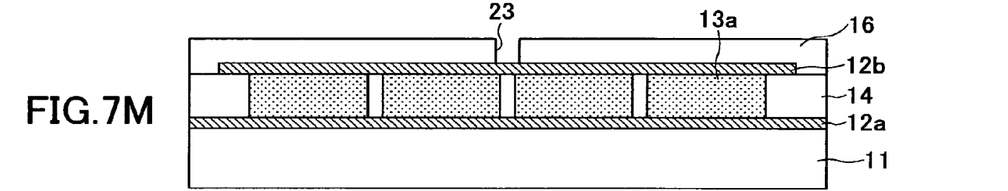

Then, referring to FIG. 7M, a via hole 23 for contact with the upper electrode 12b is formed in the insulation layer 16. The via hole 23 is formed by forming a photoresist mask (not shown) and etching the insulation layer 16 through the openings in the mask by RIE or the like.

Figure 7N:
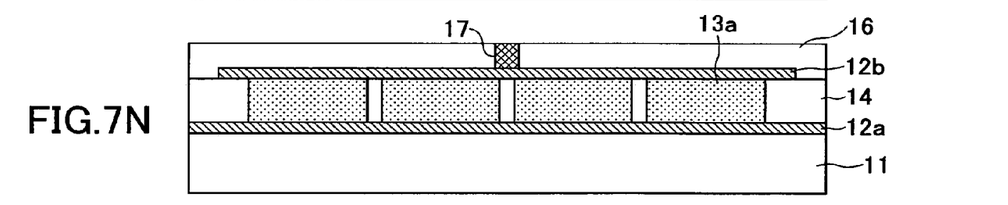

Then, referring to FIG. 7N, the via hole 23 is filled with metal such as, e.g., gold (Au) by sputtering or plating. After that, excess gold is removed, so that the via contact 17 is formed.

Figure 7O:
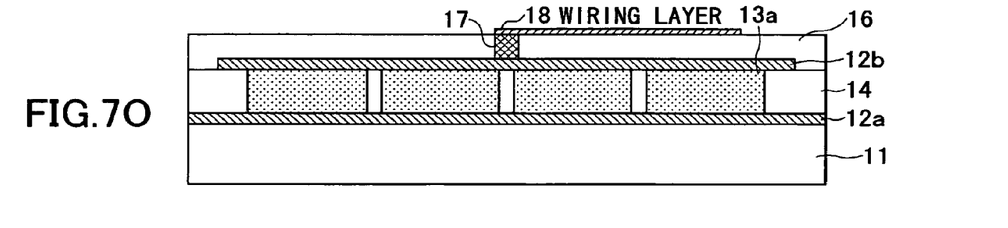

In the last step, as shown in FIG. 7O, the wiring layer 18 is formed that is connected to the via contact 17. In place of the wiring layer 18, a pad for bonding a lead may be formed by sputtering, vacuum deposition or the like using a metal through mask if the upper part of the via contact 17 is a pad.

The substrate 11 with the elements formed in the above-described process may be cut into a cantilever shape by a dicing saw. If the substrate 11 is used as the suspension 25, the substrate 11 is formed of a metal plate and cut and processed into the shape of the suspension 25.

In the above-described embodiments, since the amorphous film 21 of the piezoelectric ceramic is patterned to form the piezoelectric regions 13a in a predetermined arrangement before being crystallized, heat stress is reduced, thereby preventing cracking of the piezoelectric pattern 13 and warpage of the substrate 11 even after temperature is lowered.

Although the thin-film piezoelectric actuator/sensor 10 is illustrated by way of example in the above-described preferred embodiments, the configuration and the method of the present invention may be applicable to other thin-film piezoelectric devices using piezoelectric materials such as acceleration sensors, pressure sensors, and displacement sensors using piezoelectric materials.

The present application is based on Japanese Priority Application No. 2006-095248 filed on Mar. 30, 2006, with the Japanese Patent Office, the entire contents of which are hereby incorporated by reference.

What is claimed is:

1. A thin-film piezoelectric device comprising:
    a substrate;
    a first common electrode formed over the substrate;
    a piezoelectric pattern disclosed on the first common electrode, the piezoelectric pattern including a plurality of spaced-apart piezoelectric regions; and
    a second common electrode formed over the piezoelectric pattern,
    wherein each piezoelectric region is elongated in a longitudinal direction of the substrate and is arranged longitudinally offset relative to the adjacent piezoelectric region in a width direction of the substrate.

2. A thin-film piezoelectric device comprising:
    a substrate;
    a first common electrode formed over the substrate;
    a piezoelectric pattern disposed on the first common electrode, the piezoelectric pattern including a plurality of spaced-apart piezoelectric regions; and
    a second common electrode formed over the piezoelectric pattern,
    wherein the piezoelectric regions are spaced apart by one or more first spacing sections extending in a longitudinal direction of the substrate and one or more second spacing sections extending in a width direction of the substrate; and the piezoelectric regions are arranged such that the second spacing section does not extend in the width direction of the substrate uninterrupted by at least one of the piezoelectric regions.

3. The thin-film piezoelectric device as claimed in claim 1, further comprising:

a resin disposed between the piezoelectric regions.

4. A thin-film piezoelectric device comprising:

a substrate;

a piezoelectric pattern disposed on the substrate, the piezoelectric pattern including a plurality of spaced-apart piezoelectric regions;

a pair of electrodes that apply an electric field to the piezoelectric pattern; and a resin disposed between the piezoelectric regions, wherein the resin is formed of piezoelectric resin.

5. A piezoelectric actuator/sensor comprising:

the thin-film piezoelectric device of claim 1.

6. A magnetic head support mechanism comprising:

a magnetic head;

a suspension substrate that supports the magnetic head; and a thin-film piezoelectric actuator/sensor disposed on the suspension substrate;

wherein the thin-film piezoelectric actuator/sensor includes:

a piezoelectric pattern disposed on the substrate, the piezoelectric pattern including a plurality of spaced-apart piezoelectric regions;

a pair of electrodes that apply an electric field to the piezoelectric pattern; and a resin disposed between the piezoelectric regions, wherein the resin is formed of piezoelectric resin.

7. The magnetic head support mechanism as claimed in claim 6, wherein each piezoelectric region is elongated in a longitudinal direction of the suspension substrate and is arranged longitudinally offset relative to the adjacent piezoelectric region in a width direction of the suspension substrate.

8. The thin-film piezoelectric device as claimed in claim 2, further comprising:

a resin disposed between the piezoelectric regions.

9. A piezoelectric actuator/sensor comprising:

the thin-film piezoelectric device of claim 2.

\* \* \* \* \*

UNITED STATES PATENT AND TRADEMARK OFFICE
CERTIFICATE OF CORRECTION

PATENT NO. : 7,595,581 B2
APPLICATION NO. : 11/487509
DATED : September 29, 2009
INVENTOR(S) : Tsuyoshi Aoki It is certified that error appears in the above-identified patent and that said Letters Patent is hereby corrected as shown below:

Col. 6, line 48, delete "disclosed" and insert --disposed--.

Signed and Sealed this

Nineteenth Day of January, 2010

David J. Kappos
*Director of the United States Patent and Trademark Office*